United States Patent [19]

Sparkman et al.

[11] Patent Number: 5,377,072
[45] Date of Patent: Dec. 27, 1994

[54] SINGLE METAL-PLATE BYPASS CAPACITOR

[75] Inventors: Aubrey K. Sparkman; Kevin A. Calhoun; Jonathan C. Dahm; Joseph M. Haas, Jr., all of Austin; Rolando J. Osorio, Manchacha, all of Tex.

[73] Assignee: Motorola Inc., Schaumburg, Ill.

[21] Appl. No.: 179,275

[22] Filed: Jan. 10, 1994

[51] Int. Cl.$^5$ .................. H01G 1/03; H01G 4/10; H01G 4/38
[52] U.S. Cl. .................. 361/306.2; 361/313; 361/322; 361/330; 257/532; 257/724
[58] Field of Search .......... 361/301.2, 303–305, 361/306.1, 306.2, 306.3, 308.1, 308.3, 310, 311–313, 320, 328, 330, 734, 322; 257/528, 532, 723, 724, 725, 296

[56] References Cited

U.S. PATENT DOCUMENTS

| | | | |
|---|---|---|---|
| 3,268,744 | 8/1966 | Kaiser et al. | 361/306.2 |
| 4,167,018 | 9/1979 | Ohba et al. | 257/296 |
| 4,914,546 | 4/1990 | Alter | 361/313 |
| 4,929,989 | 5/1990 | Hayano | 257/296 |
| 5,049,979 | 9/1991 | Hashemi et al. | 257/723 |
| 5,055,905 | 10/1991 | Anmo | 257/532 |
| 5,083,184 | 1/1992 | Eguchi | 257/532 |
| 5,095,402 | 3/1992 | Hernandez et al. | 361/306.2 |
| 5,140,496 | 8/1992 | Heinks et al. | 361/306.2 |
| 5,187,637 | 2/1993 | Embree | 361/313 |
| 5,281,846 | 1/1994 | Kaiser | 257/528 |
| 5,311,057 | 5/1994 | McShane | 257/723 |
| 5,313,693 | 5/1994 | Cachier | 29/25.03 |

Primary Examiner—Bruce A. Reynolds
Assistant Examiner—Gregory L. Mills
Attorney, Agent, or Firm—Jasper W. Dockrey

[57] ABSTRACT

A single metal-plate bypass capacitor (10) includes a metal top plate (26) separated from a silicon substrate (12) by a thermally-grown, silicon dioxide dielectric (16) layer. An additional silicon plate (36) can be included intermediate to the metal top plate (26) and the silicon substrate (12) for multiple power supply devices. The silicon substrate (12) is electrically accessed through a metal contact pad (28) overlying a doped region (34) of the silicon substrate (12). The metal contact pad (28) is electrically isolated from the top plate (26) by an isolation structure (30). The bypass capacitor (10) is designed to be attached directly to the top surface of a semiconductor device (18), which enables the bypass capacitor (10) to be interconnected to the semiconductor device (18) by a plurality of bonding wires (25) having a minimal length. Because the capacitor dielectric (16) is formed as a very thin layer by the thermal oxidation of silicon, the self-inductance of bypass capacitor (10) is minimized.

13 Claims, 2 Drawing Sheets

SINGLE METAL-PLATE BYPASS CAPACITOR

FIELD OF THE INVENTION

This invention relates, in general, to bypass capacitors used in packaged semiconductor devices, and more particularly, to close-attached-capacitors electrically coupled to high-speed semiconductor devices.

BACKGROUND OF THE INVENTION

High-speed semiconductor devices are complex and contain thousands or even millions of circuit elements, such as transistors, logic circuits, and the like. When a large number of circuits are switched to different logic states, the power supply providing power and ground signals to the circuits is momentarily stressed by the sudden increase in electrical current. The momentary degradation in supply voltage, caused by the rapid switching of a large number of circuits, can cause performance degradation in the semiconductor device. For example the increased line noise created by a power supply fluctuation can cause a loss in signal transmission speed, rise time degradation, and false switching of logic gates.

To avoid a drop in the power supply voltage, caused by the rapid switching of a large number of circuits, a common practice is to include a bypass capacitor to stabilize current surges, and to avoid a momentary drop in power supply voltage. In low-frequency devices, bypass capacitors are incorporated into the package housing of the semiconductor device; or alternatively, the bypass capacitors are located completely external to the device package and are mounted on a printed circuit board. Although bypass capacitors mounted in either the device package or on the circuit board are effective in reducing performance degradation of semiconductor devices operating at low frequency, the self-inductance and line inductance incurred by using remotely located bypass capacitors is too great for high-performance devices operating at high frequencies. Thus, the line inductance and the capacitor self-inductance limits the use of external capacitors for high speed devices.

To reduce the length of the interconnections between the bypass capacitor and the device, which also reduces the line inductance, bypass capacitors are mounted directly to the upper surface of the semiconductor device. A close-attached-capacitor (CAC) can be used to reduce the length of interconnections and hence the line inductance to the capacitor. This technique is described in U.S. Pat. No. 5,049,979 to S. H. Hashemi, et al., issued Sep. 17, 1991. By mounting the bypass capacitor directly to the upper surface of the semiconductor device, the line inductance between the capacitor and the device is substantially reduced. The lower inductance reduces the AC voltage noise induced by the capacitor in the power distribution network of the device as the logic circuits rapidly switch on and off.

Although the CAC improves the operation of a high-performance semiconductor device by reducing line inductance, the CAC itself continues to have a large amount of internal inductance. The high internal inductance of the CAC is similar to that of bypass capacitors mounted in the device package, and on a printed circuit board. These capacitors have a large surface area, yet are internally constructed in such a way as to generate high internal inductance. Accordingly, further development of CAC type bypass capacitors is necessary to meet the performance requirements of high-speed semiconductor devices.

SUMMARY OF THE INVENTION

In practicing the present invention there is provided a single metal-plate bypass capacitor for mounting to the surface of a semiconductor device, which includes a single metal capacitor plate. In one embodiment, the single metal plate overlies a silicon substrate and is separated from the substrate by a thin, highly-pure silicon dioxide layer. The silicon substrate serves as the second capacitor plate. A gate dielectric layer overlies a silicon substrate. A metal capacitor plate overlies the gate dielectric layer, and a metal contact pad overlies the silicon substrate. The metal contact pad is in intimate contact with a portion of the silicon substrate at the periphery of the metal capacitor plate. The metal contact pad surrounds the metal capacitor plate and is electrically isolated from the plate by an electrical isolation structure. The metal contact pad electrically couples a plurality of bonding wires to the silicon substrate.

Figure 1:
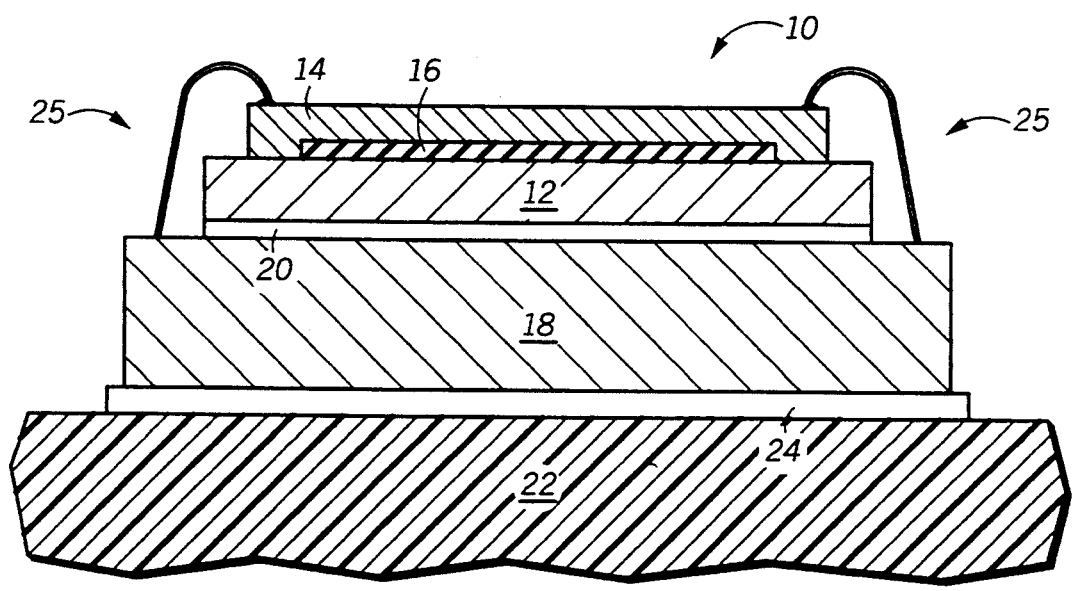
FIG. 1 illustrates, in cross-section, a bypass capacitor of the invention mounted to the surface of a semiconductor device, which is in turn mounted to the bonding area of a device package.

It will be appreciated that for simplicity and clarity of illustration, elements shown in the FIGURES have not necessarily been drawn to scale. For example, the dimensions of some of the elements are exaggerated relative to each other for clarity. Further, where considered appropriate, reference numerals have been repeated among the FIGURES to indicate corresponding elements.

DETAILED DESCRIPTION OF PREFERRED EMBODIMENTS

FIG. 1 illustrates, in cross-section, a single metal-plate bypass capacitor 10 of the present invention mounted to the upper surface of a semiconductor device 18. Semiconductor device 18 is attached to a die bond area 22 of a device package. A metal plate assembly 14 of bypass capacitor 10 overlies a silicon substrate 12, and a capacitor dielectric 16 separates a portion of metal assembly 14 from silicon substrate 12. Bypass capacitor 10 is attached to semiconductor device 18 by an adhesive layer 20. Semiconductor device 18 is, in turn, attached to die bond area 22 by a bonding compound 24. A bonding wire 25 is attached to a portion of metal assembly 14 and to a bonding pad (not shown) on the upper surface of semiconductor device 18. Bonding wire 25 is one of a number of bonding wires which electrically couple bypass capacitor 10 to semiconductor device 18. It is important to note that bypass capacitor 10 is mounted on the upper surface of semiconductor device 18 in such a way as to permit a number of bonding wires 25 to be attached to bypass capacitor 10 and to semiconductor device 18, and further that bypass capacitor 10 is positioned in such a way that the length of bonding wires 25 is minimized. Bonding wires 25 interconnect the plates of bypass capacitor 10 with power and ground terminals on semiconductor device 18. The attachment of bypass capacitor 10 on the upper surface of semiconductor device 18 enables bypass capacitor 10 to be electrically coupled to semiconductor device 18 using minimal length bonding wires 25. By reducing the length of bonding wires 18, the inductance of the bonding wires is reduced increasing the overall performance of bypass capacitor 10.

Figure 2:
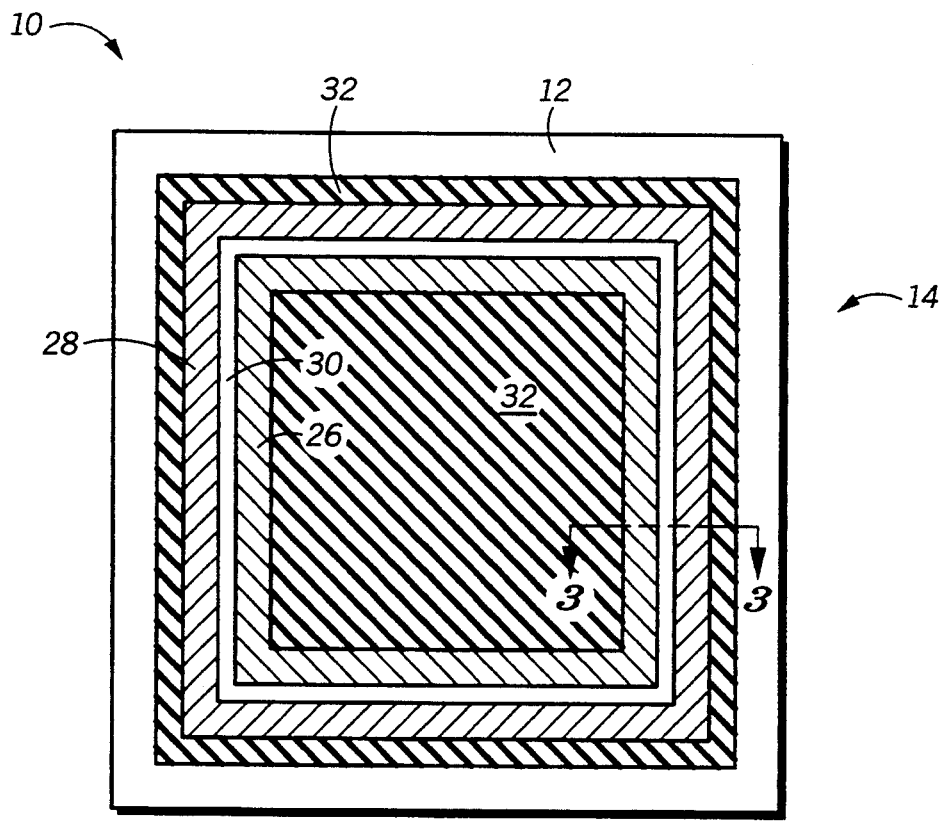
FIG. 2 illustrates, in plan view, the upper surface of the bypass capacitor of the invention showing in detail the metal plate assembly of the bypass capacitor.

A plan view of bypass capacitor 10 is illustrated in FIG. 2. The detailed construction of metal assembly 14 is illustrated showing connection portions of a top capacitor plate 26, and a substrate contact pad 28. Bonding wires 25, shown in FIG. 1, are connected to either top plate 26 or to substrate contact pad 28, as required, to interconnect bypass capacitor 10 to power and ground bonding pads on semiconductor device 18. An electrical isolation structure 30 electrically separates top plate 26 from substrate contract pad 28. A passivation layers 32 overlies a central portion of top plate 26, and a perimeter portion of substrate contact pad 28. A portion of the upper surface of silicon substrate 12 extends beyond the perimeter of metal assembly 14. Silicon substrate 12 functions as the lower electrode plate for bypass capacitor 10, and also as the substrate upon which metal assembly 14 is fabricated. Exposed surfaces of silicon substrate 12 are coated with a dielectric material (not shown) to prevent unwanted electrical contact to silicon substrate 12 external electrically conductive elements, such as bonding wires 25.

Figure 3:
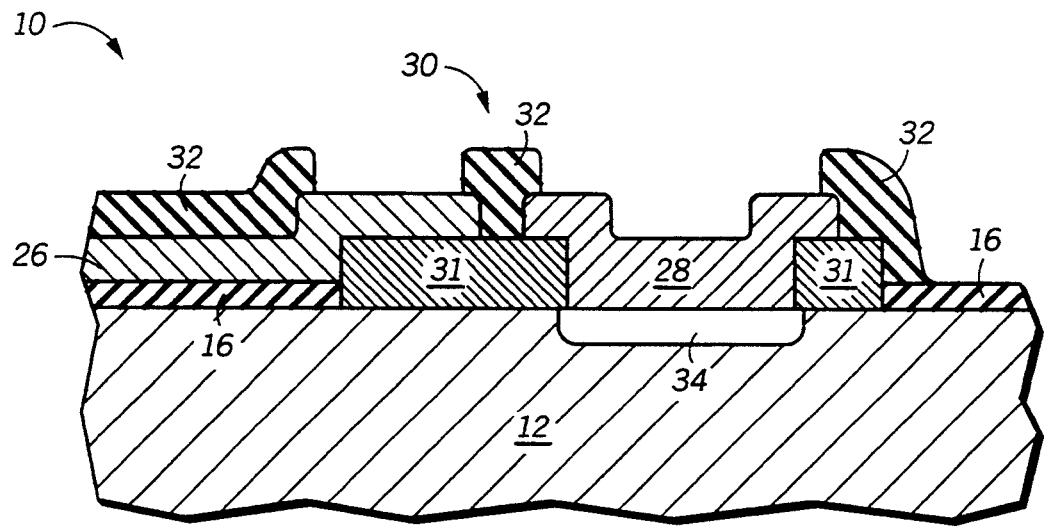
FIG. 3 illustrates, in cross-section, a portion of the bypass capacitor of the invention taken along section line 3—3 of FIG. 2.

FIG. 3 illustrates, in cross-section, a portion of bypass capacitor 10 taken along section line 3—3 of FIG. 2. The spatial relationship of the various elements comprising bypass capacitor 10 can be understood by reference to FIGS. 2 and 3. Top plate 26 is separated from silicon substrate 12 by capacitor dielectric 16. As previously described, top plate 26, capacitor dielectric 16, and silicon substrate 12 form the functional components of a parallel plate capacitor. Electrical contact is made to silicon substrate 12 by substrate contact pad 28. A doped contact region 34 resides in silicon substrate 12 directly below substrate contact pad 28 and forms an ohmic contact between contact pad 28 and substrate 12.

The electrical isolation of top plate 26 and contact pad 28 is provided by patterned portions of two electrically insulating layers. A first electrical isolation layer 31 overlies the surface of substrate 12, and a passivation layer 32 overlies isolation layer 31. Dielectric isolation structure 30 includes a portion of isolation region 31 overlying the surface of silicon substrate 12, and a portion of passivation layer 32 overlying isolation region 31. Contact pad 28 is similarly electrically protected by a portion of isolation region 31 and together passivation layer 32 formed around the perimeter of contact pad 28. Passivation layer 32 also covers a substantial portion of top plate 26, leaving only a narrow region at the perimeter of top plate 26 for contact by bonding wires 25.

The use of a silicon substrate as a lower capacitor plate enables the direct fabrication of bypass capacitor 10 using conventional silicon process technology. The fabrication of bypass capacitor 10 is straightforward. Silicon substrate 12 comprises a silicon wafer commonly used in the fabrication of integrated circuit devices. Substrate 12 is (1-0-0) silicon substrate having a resistivity of about 0.10 ohm-cm or less. To begin fabrication, silicon substrate 12 is oxidized in a steam oxidation process to form an isolation oxide layer having a thickness of about 3000 to 9000 angstroms. Then, a photolithographic pattern is formed on the isolation oxide layer, and a wet chemical etching process is used to form isolation regions 31.

After forming isolation regions 31, a sacrificial oxide layer is grown on the exposed surface of silicon substrate 12 and a photolithographic pattern is formed to define doped contact region 34. Doped contact region 34 is formed by an implantation of phosphorus using an implant dose of about $5 \times 10^{15}$ ions per square centimeter.

Once doped contact region 34 is formed, the sacrificial oxide layer is removed by wet chemical etching and a dry oxidation process is carried out to form capacitor dielectric 16. Preferably, capacitor dielectric 16 is thermally grown to a thickness of about 400 to 800 angstroms. A distinct advantage of the present invention arises from the formation of the capacitor dielectric by thermal oxidation of a silicon surface. The oxidation process can be highly controlled to form a capacitor dielectric having a precise thickness. Additionally, the dry oxidation process forms a capacitor dielectric of high purity. The ability to form the capacitor dielectric as a very thin, highly-pure silicon dioxide layer enhances the performance of bypass capacitor 10.

A photolithographic pattern is now formed and a portion of capacitor dielectric layer 16 is etched to expose portions of silicon substrate 12 for the formation of a metal contact to doped region 34. Following the removal of capacitor dielectric overlying doped region 34, a metal deposition process is performed to deposit a layer of metal, which contacts silicon substrate 12 and which overlies remaining portions of capacitor dielectric 16. The metal deposition process can be carried out using any conventional metal deposition process. For example, the metal can be deposited in an E-beam metal evaporation system, or in an RF sputtering deposition system, or the like. Preferably, a metal alloy layer comprising aluminum, silicon, and copper is sputter deposited onto the substrate. Alternatively, other metals such as silicon-aluminum, titanium-tungsten, copper, and the like, can be deposited to form top plate 26.

After depositing a layer of metal, a photolithographic pattern is formed and the metal layer is etched to define top plate 26, and to define substrate contact pad 28. Preferably, the metal layer is etched in a wet chemical etching solution appropriate to the particular metal. In the case of an aluminum-copper-silicon metal, the metal is etched in a solution including phosphoric acid. Alternatively, the metal layer can be etched in a dry plasma etch. Next, a passivation layer is deposited by either chemical vapor deposition (CVD), or by plasma enhanced chemical vapor deposition (PECVD). The passivation layer is doped with phosphorus during the deposition process to have a phosphorous concentration of approximately 2 to 6 weight percent. Finally, the passivation layer is patterned to form openings exposing contact regions of top plate 26 and substrate contact pad 28.

Those skilled in the art will appreciate that the bypass capacitor of the invention can be fabricated using conventional, well-developed integrated circuit fabrication processes. Furthermore, the utilization of a silicon substrate as a bottom capacitor plate enables the formation of a thin, high-purity capacitor dielectric layer using a conventional, dry-thermal oxidation process. The fabrication of a very thin capacitor dielectric reduces the internal inductance of the capacitor, reducing the voltage drop during high frequency operation of the semiconductor device. Additionally, the fabrication of the bypass capacitor of the present invention on a silicon substrate using a conventional integrated circuit fabrication process serves to substantially reduce the fabrication costs, as compared with bypass capacitors of the prior art.

When the single metal-plate bypass capacitor of the invention is connected to a power supply, providing power and ground signals to the logic circuitry of a semiconductor device, the drop in voltage experienced by the power supply is substantially less than that observed in the absence of a bypass capacitor. The drop in voltage is also substantially less than that experienced by a device coupled to a dual-plate capacitor of the prior art.

Table I provides comparative power supply sag values for the single metal-plate capacitor of the invention, and for a dual-plate capacitor of the prior art. Both capacitors were electrically coupled to a "Motorola Digital Signal Processor" having part number DSP 96002.

TABLE I

| | Power Supply Sag (volts) | |
|---|---|---|
| | No Capacitor | Capacitor connected across guiet supply |
| Single metal-plate Capacitor | 0.552 | 0.245 |
| Dual-Plate Capacitor (prior art) | 0.552 | 0.458 |

The both the single metal-plate capacitor and the dual-plate capacitor were mounted to the upper surface of a standard logic device. Accordingly, both capacitors have a similar amount of inductance rising from bonding wires connecting the capacitor to the standard logic device.

The data shown in Table I indicates that the voltage-drop is reduced by about half of that experienced in the absence of a bypass capacitor. Furthermore, the single metal-plate bypass capacitor of the invention reduces the voltage drop experienced by the power supply to a substantially lower level than that of the dual metal capacitor of the prior art. The superior performance of the present invention relates, in part, to the presence of a thin capacitor dielectric formed by the thermal oxidation of silicon substrate 12.

Figure 4:
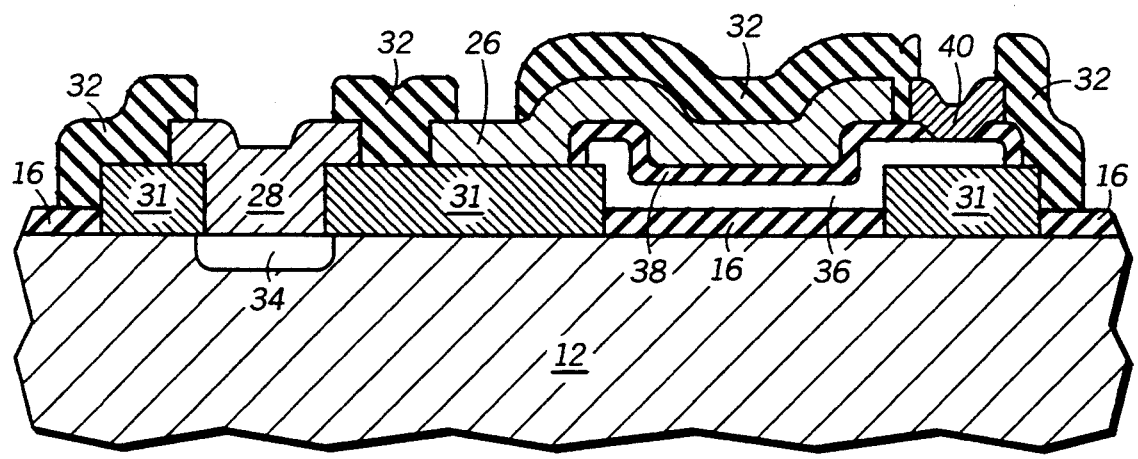
FIG. 4 illustrates, in cross-section, a bypass capacitor in accordance with another embodiment of the invention having a silicon reference plane intermediate to the metal top plate and the silicon substrate.

Shown in FIG. 4 is another embodiment of the invention having a silicon plate 36 intermediate to top plate 26 and silicon substrate 12. Silicon plate 36 is separated from top plate 26 by a second dielectric layer 38. A metal contact 40 resides adjacent to top plate 26, and is electrically isolated from top plate 26 by portion of passivation layer 32. Silicon plate 36 can be either polycrystalline silicon, or amorphous silicon. Silicon plate 36 is preferably deposited by a CVD process, and doped with a conductivity determining dopant either during or immediately after deposition.

Once silicon plate 36 is deposited, second dielectric layer 38 can be grown on silicon plate 36 using a thermal oxidation process. Thus, the embodiment illustrated in FIG. 4 advantageously benefits from the formation of first and second capacitor dielectric layers formed by a thermal oxidation process. The second dielectric layer can be grown to a precisely controlled thickness. Low self-inductance in the bypass capacitor is maintained because all capacitor dielectric layers are thin, high-purity, silicon dioxide. The addition of silicon plate 36 provides an additional reference plane for a semiconductor device having two power supplies. For example, a semiconductor device operating at 3.5 volts and 5.0 volts.

Thus it is apparent that there has been provided, in accordance with the invention, a single metal-plate bypass capacitor which fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, the bypass capacitor can be interconnected to a semiconductor device by tape-automated-bonded (TAB) leads. It is therefore intended to include within the invention all such variations and modifications as fall within the scope of the appended claims and equivalents thereof.

We claim:

1. A bypass capacitor for mounting to the surface of a semiconductor device comprising:
    a silicon substrate bonded to the semiconductor device by an adhesive layer,
    wherein the silicon substrate forms a bottom capacitor plate;
    a gate dielectric layer overlying the silicon substrate;
    a metal capacitor plate overlying the gate dielectric layer;
    a metal contact pad overlying and in intimate contact with the silicon substrate,
    wherein the contact pad surrounds and is electrically isolated from the metal capacitor plate, and
    wherein the contact pad electrically couples a plurality of bonding wires to the silicon substrate.

2. The bypass capacitor of claim I further comprising a doped region in the substrate directly below the metal contact pad.

3. The bypass capacitor of claim 1, wherein the gate dielectric layer comprises a layer of silicon dioxide formed by thermally oxidizing the silicon substrate.

4. The bypass capacitor of claim 1 further comprising:
    an electrical insulation structure formed on the surface of the silicon substrate to provide electrical isolation between the capacitor plate and the contact pad,
    wherein the structure includes a patterned insulation layer overlying the surface of the silicon substrate and a passivation layer overlying the patterned insulation, and
    wherein the passivation layer overlies an edge portion of the capacitor plate and the contact pad.

5. A bypass capacitor for mounting to the surface of a semiconductor device comprising:
    a silicon substrate bonded to the semiconductor device,
    wherein the substrate includes an isolation region separating the substrate into first and second surface regions;
    a first dielectric layer overlying the first surface region;
    a doped region in the substrate below the second surface region;

a metal capacitor plate overlying the gate dielectric layer;

a metal contact pad overlying and in intimate contact with the second surface region; and a passivation layer overlying the isolation region and the capacitor plate and the contract pad.

6. The bypass capacitor of claim 5 further comprising a series of bonding wires attached to the metal contact pad and electrically coupled to the semiconductor device.

7. The bypass capacitor of claim 5, wherein the first dielectric layer comprises a layer of silicon dioxide formed by thermally oxidizing the silicon substrate.

8. The bypass capacitor of claim 7 further comprising:

a silicon plate intermediate to the metal capacitor plate and the gate dielectric layer; and a second dielectric layer overlying the silicon plate and separating the metal capacitor plate therefrom.

9. The bypass capacitor of claim 8, wherein the silicon plate is a silicon material selected from the group consisting of polycrystalline silicon and amorphous silicon.

10. The bypass capacitor of claim 9, wherein the second dielectric layer comprises a layer of silicon dioxide formed by thermally oxidizing the silicon plate.

11. A bypass capacitor mounted to the surface of a semiconductor device comprising:

a semiconductor device mounted to a die-bond area of a device package, the semiconductor device having an upper surface and a plurality of bonding pads at a perimeter of the upper surface;

a single metal-plate bypass capacitor mounted to a central portion of the upper surface of the semiconductor device, the single metal-plate bypass capacitor comprising, a silicon substrate having a silicon dioxide layer overlying the substrate, and a metal capacitor plate overlying the silicon dioxide layer, and a metal contact pad overlying and in intimate contact with the silicon substrate; and a plurality of bonding wires electrically coupling the metal capacitor plate and the metal contact pad to the bonding pads on the semiconductor device.

12. The bypass capacitor of claim 11 further comprising a passivation layer overlying the metal capacitor plate and the contact pad, wherein the passivation layer exposes bonding surfaces on the capacitor plate and the contact pad.

13. The bypass capacitor of claim 11 further comprising a doped region in the silicon substrate directly below the metal contact pad.

* * * * *

UNITED STATES PATENT AND TRADEMARK OFFICE
CERTIFICATE OF CORRECTION

PATENT NO. : 5,377,072
DATED : Dec. 27, 1994
INVENTOR(S) : Aubrey K. Sparkman; Kevin A. Calhoun; Jonathan C. Dahm; Joseph M. Haas, Jr.; Rolando J. Osorio It is certified that error appears in the above-indentified patent and that said Letters Patent is hereby corrected as shown below:

In Claim 2, Column 6, Line 39,
    after "claim", change "I" to --1--.

In Claim 5, Column 7, Line 6,
    after "pad" remove "." and insert --,--.

In Claim 5, Column 7, Line 7,
    create a new line and add --wherein the passivation layer exposes bonding surfaces on the capacitor plate and the contact pad--.

Signed and Sealed this

Sixth Day of June, 1995

Attest:

BRUCE LEHMAN

Attesting Officer     Commissioner of Patents and Trademarks